(12) United States Patent
Fu (10) Patent No.: US 7,216,421 B2
(45) Date of Patent: May 15, 2007

(54) STAMPING MACHINE FOR MOUNTING RETENTION FRAME OF HEAT SINK TO MOTHERBOARD

(75) Inventor: JunLin Fu, ShenzHen (CN)

(73) Assignees: Hong Fu Jin Precision Ind. (Shenzhen) Co., Ltd., Shenzhen (CN); Hon Hai Precision Ind. Co., Ltd., Tu-Cheng (TW)

( * ) Notice: Subject to any disclaimer, the term of this patent is extended or adjusted under 35 U.S.C. 154(b) by 386 days.

(21) Appl. No.: 10/879,580

(22) Filed: Jun. 28, 2004

(65) Prior Publication Data
US 2005/0000089 A1 Jan. 6, 2005

(30) Foreign Application Priority Data
Jun. 27, 2003 (TW) .............................. 92211785 U (51) Int. Cl.
*B23P 19/00* (2006.01)
(52) U.S. Cl. .............................. 29/761; 29/709; 29/739
(58) Field of Classification Search .................. 29/739, 29/757, 761, 709, 715, 788, 799; 83/140, 83/142, 143, 132, 136
See application file for complete search history.

(56) References Cited
U.S. PATENT DOCUMENTS

| | | | | |
|---|---|---|---|---|
| 1,660,720 A | * | 2/1928 | Osborne ...................... 91/356 |
| 2,488,205 A | * | 11/1949 | Kopczyniski ................. 83/140 |
| 2,652,732 A | * | 9/1953 | Frye .............................. 408/10 |
| 2,850,035 A | * | 9/1958 | Brown ..................... 137/224.5 |
| 3,086,418 A | * | 4/1963 | Levine ......................... 83/635 |
| 3,371,254 A | * | 2/1968 | Hagfors ...................... 361/189 |
| 3,496,818 A | * | 2/1970 | Porter et al. .................. 83/140 |
| 4,462,291 A | | 7/1984 | Schulz |
| 6,631,556 B2 | * | 10/2003 | Lee ............................. 29/832 |

* cited by examiner

*Primary Examiner*—A. Dexter Tugbang
*Assistant Examiner*—Livius R. Cazan
(74) *Attorney, Agent, or Firm*—Wei Te Chung (57) ABSTRACT

A stamping machine for mounting a retention frame of heat sink (510) to a motherboard (500) includes a machine body (100), an adjusting device (200), and a controlling unit (300). The machine body comprises a support plane (110) and a stamping arm (120) extending upwardly from the support plane. A plurality of adjusting positioning blocks (112) is provided on the support plane for fittingly positioning the motherboard. A stamping assembly (130) is positioned at a forepart of the stamping arm comprises a cylinder (140), a stamping block (150) moveably connected to the cylinder, and a base portion (114) attached on the support plane corresponding to the stamping block. A plurality of stamping posts (170) extends from the stamping block and a plurality of retractable pressing pins (180) depends from the stamping block. A resilient member (190) is disposed around each of the pressing pins.

15 Claims, 7 Drawing Sheets

STAMPING MACHINE FOR MOUNTING RETENTION FRAME OF HEAT SINK TO MOTHERBOARD

BACKGROUND OF THE INVENTION

1. Field of the Invention

The present invention relates to a stamping machine, and particularly to a stamping machine used for mounting a retention frame of a heat sink to a motherboard.

2. Description of the Prior Art

Nowadays when a large heat sink is to be attached to a heat generating package such as a Central Processing Unit (CPU), a retention frame is often attached to a motherboard around the CPU in order to provide support for retaining the heat sink. There should be a suitable uniform distance between a bottom face of the retention frame and a top face of the motherboard. If the distance is not uniform, this is known as "floating high." When floating high exists, it results in non-uniform contact between the heat sink and the CPU, and reduced heat transfer efficiency. The CPU may overheat until it malfunctions or is even damaged beyond repair.

Figure 6:
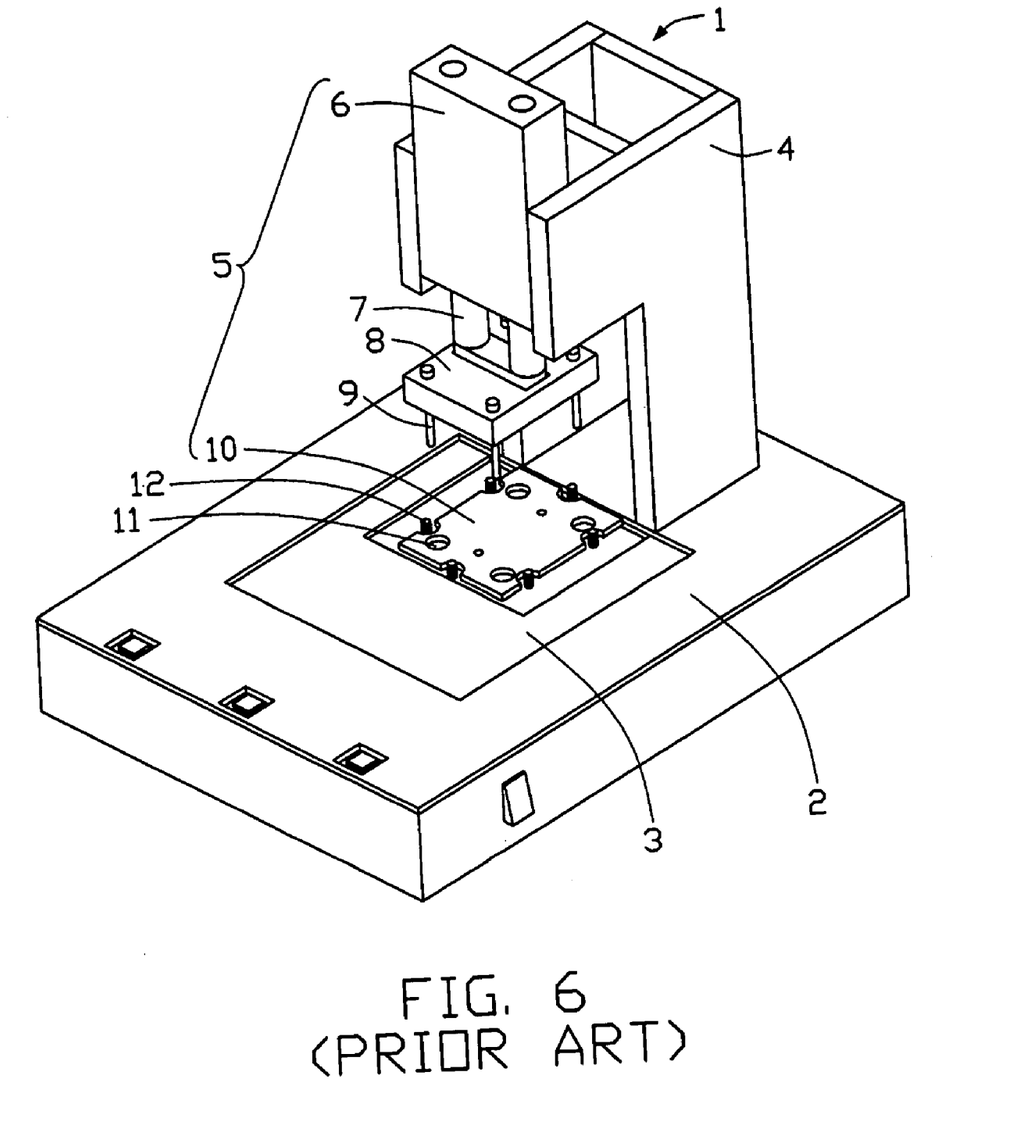
FIG. 6 is an isometric view of a conventional stamping machine.

A conventional stamping machine for mounting a retention frame of a heat sink to a motherboard is shown in FIG. 6. The stamping machine 1 comprises a support plane 2 and a stamping arm 4. A recessed receiving portion 3 is formed in a top surface of the support plane 2. The receiving portion 3 is similar to the motherboard (not shown) in shape and size, so that an operator can precisely position the motherboard by inserting it into the receiving portion 3. A stamping assembly 5 comprises a cylinder 6 positioned at a forepart of the stamping arm 4, a stamping block 8 connected to a pair of pistons 7 at a lower end of the cylinder 6, and a support portion 10 disposed in the receiving portion 3. Four stamping posts 9 extend downwardly from four corners of the stamping block 8 respectively. A plurality of cutouts 11 is defined in the support portion 10, corresponding to the stamping posts 9. A plurality of rigid support posts 12 extends upwardly from the support plane 2 in the recess. The support posts 12 are arranged in regular formation around the support portion 10. The stamping block 8 can be driven up and down by the pistons 7 of the cylinder 6.

Figure 7:
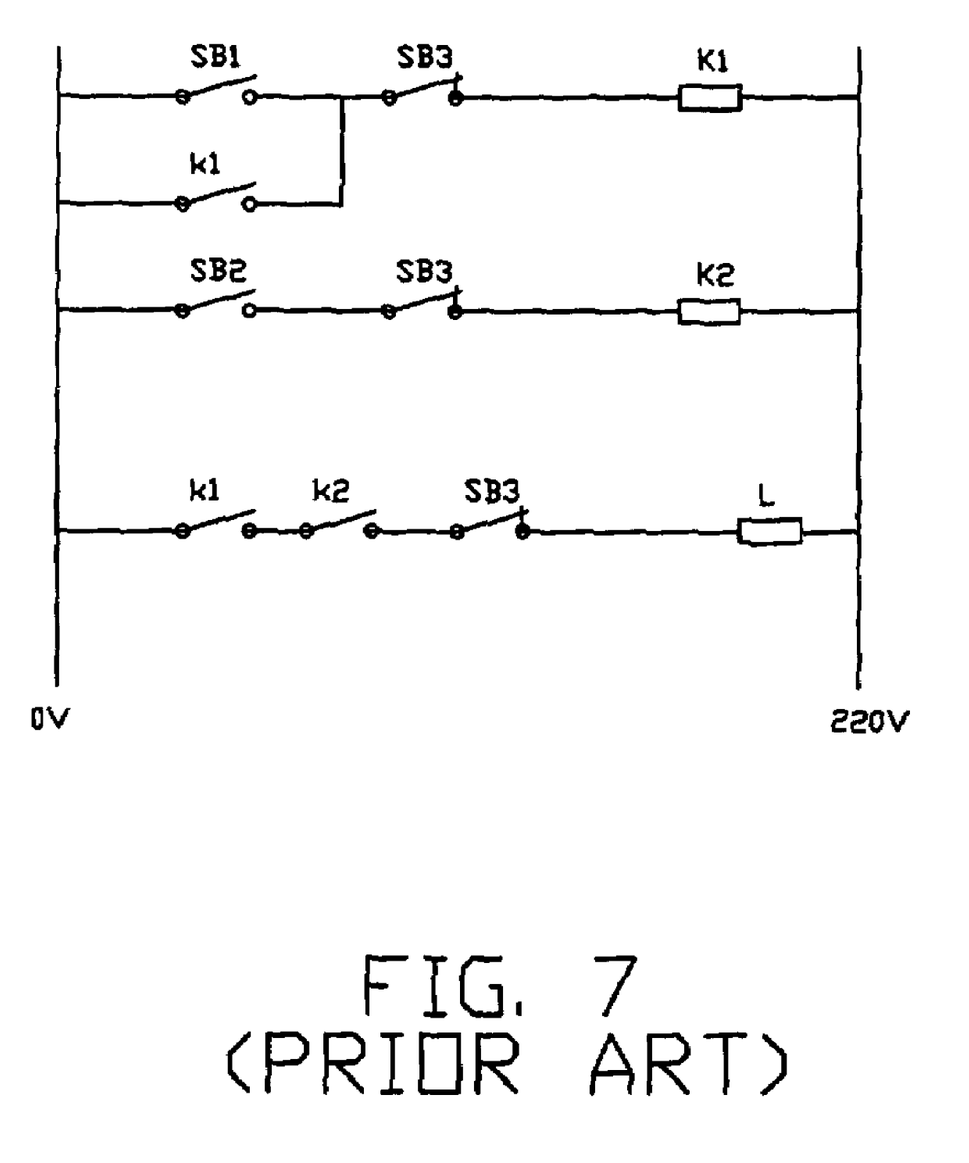
FIG. 7 is a schematic diagram of a program logic control circuit of the stamping machine of FIG. 6.

The stamping machine 1 uses an Alternating Current (AC) of 220V, and the inner control circuit comprises high-voltage components. Referring also to FIG. 7, the control circuit of the stamping machine 1 comprises a first loop, a second loop and a third loop (not labeled). These loops comprise relays K1, K2, touch switches SB1, SB2, SB3 (a touch switch is a switch that is powered on when pressed and is powered off when released), an electromagnetic valve L, and switches k1, k2. The touch switches SB1, SB2 are for controlling the circuit, the touch switch SB3 is for resetting the circuit, the electromagnetic valve L is for controlling the cylinder 6, and the switches k1, k2 are common switches controlled by the relays K1, K2 respectively.

When the touch switch SB1 is pressed to switch on the first loop, the switch k1 is closed under control of the relay K1 to initialize the control circuit. Then, the touch switch SB2 is pressed to switch on the second loop. The switch k2 is closed under control of the relay K2. The electromagnetic valve L controls the cylinder 6 to charge with air, so that the pistons 7 drive the stamping block 8 downwardly. After stamping, the touch switch SB2 is released so that the second loop is switched off. The switch k2 is opened under control of the relay K2, so that the third loop is switched off and the electromagnetic valve L controls the cylinder 6 to discharge with air. The stamping block 8 is then pulled upwardly by the pistons 7.

The motherboard is positioned in the receiving portion 3 of the support plane 2 prior to mounting of the retention frame. The cutouts 11 of the stamping portion 10 are in alignment with through holes (not shown) of the motherboard respectively. When an operating button (not shown) is pressed, the cylinder 6 is charged with air to drive the stamping block 8 downwardly. The stamping posts 9 of the stamping block 8 punch frustum-shaped nails in standoffs of the retention frame, so that the frustum-shaped nails are inserted in the through holes of the motherboard. The retention frame is thereby mounted to the motherboard. Then the operating button is released so that the air in the cylinder 6 is discharged, and the stamping block 8 is retracted to its original position.

However, the stamping machine 1 is liable to cause floating high, as detailed below.

From the aspect of mechanical structure: The conventional stamping machine 1 is typically produced from bakelite. Because bakelite has weak rigidity, it is easily deformed during the stamping process. In addition, the receiving portion 3 of the stamping machine 1 generally conforms to the configuration of the motherboard, so that only one type of motherboard can be fitted into it. If another type of motherboard is to be operated on, the receiving portion 3 needs to be reconfigured accordingly. This increases costs. Furthermore, the stamping posts 9 extending from four corners of the stamping block 8 only act on the standoffs at four corners of the retention frame. Therefore the retention frame is not uniformly pressed onto the motherboard.

From the aspect of air pressure adjustment: The air pressure in the stamping machine 1 cannot be adjusted, therefore the operator cannot ensure that correct pressure is driving the pistons 7. In addition, the operating button must be manually pushed and retained in position to drive the stamping block 8 down, whereupon the operator must release the operating button to return the stamping block 8 to its original position. Such manual operation is subject to human error, and cannot ensure that the retention frame is tightly mounted onto the motherboard. If the retention frame is not tightly mounted, the operator may have to repeat the stamping process several times. This leads to inefficiencies. Furthermore, the rate of stamping of the stamping block 8 cannot be automatically set. This is inconvenient, and can lead to human error on the part of the operator.

From the aspect of circuit control: The stamping machine 1 comprises an Alternating Current (AC) loop. The high-voltage components of the inner control circuit are expensive. In addition, only one button is used in operation. If the bottom is mistakenly pushed, the circuit will be closed immediately and cause an unexpected operation. Furthermore, if an unexpected contingency such as mistaken operation arises, there are no means for quickly and conveniently shutting down the circuit.

In summary, there are a variety of shortcomings in the stamping machine, and difficulties in using the stamping machine. Thus, an improved stamping machine is desired.

BRIEF SUMMARY OF THE INVENTION

Accordingly, an object of the present invention is to provide a stamping machine for conveniently and safely mounting a retention frame of heat sink to a motherboard.

To achieve the above-mentioned object, a stamping machine in accordance with a preferred embodiment of the present invention comprises a machine body, an adjusting device, and a control unit. The machine body comprises a support plane and a stamping arm extending upwardly from the support plane. A plurality of adjusting positioning blocks is provided on the support plane for fittingly positioning the motherboard. A stamping assembly is positioned at a forepart of the stamping arm. The stamping assembly comprises a cylinder, a stamping block moveably connected to the cylinder, and a base portion attached on the support plane corresponding to the stamping block. A plurality of stamping posts extends from the stamping block and a plurality of retractable pressing pins depends from the stamping block. A resilient member is disposed around each of the pressing pins. The adjusting device is positioned between the cylinder and compressed air equipment for adjusting input air pressure. The control machine is for controlling stamping of the stamping block. The advantages of the invention are described in detail below.

From the aspect of mechanical structure: The stamping machine is typically made from metal or a metal alloy such as aluminum alloy which has better rigidity. A plurality of adjustable positioning blocks is provided on a support plane of the machine body, and they can be realigned based on the size of the motherboard. This avoids reconfiguring of the stamping machine and decreases costs. In addition, a pair of retractable pressing pins depends from the stamping block, and it can ensure the rims of the retention frame to be uniformly pressed.

From the aspect of air pressure adjustment: An adjusting device is provided in the stamping machine for adjusting input air pressure to determine a correct pressure. In addition, a plurality of relays is provided in the stamping machine for ensuring a period of proper stamping time. The operator only needs to start up an automatic process. Furthermore, a throttle is provided in the stamping machine for adjusting the rate of stamping of the stamping block.

From the aspect of circuit control: The stamping machine comprises a control unit comprising an Alternating Current (AC) loop and a Direct Current (DC) loop system. The control circuit inside comprises low-voltage components. The low-voltage components are cheap. In addition, dual-series switch is used in the circuit, that is, the circuit can be powered on only when both the operating buttons are pressed at the same time. Furthermore, multi-relays are provided in the circuit for protecting the circuit when an unexpected contingency such as mistaken operation arises. And the circuit is designed with module so that it is easy to be replaced and improved.

Other objects, advantages and novel features of the present invention will be drawn from the following detailed description of preferred embodiments of the present invention with the attached drawings, in which:

DETAILED DESCRIPTION OF THE INVENTION

Figure 1:
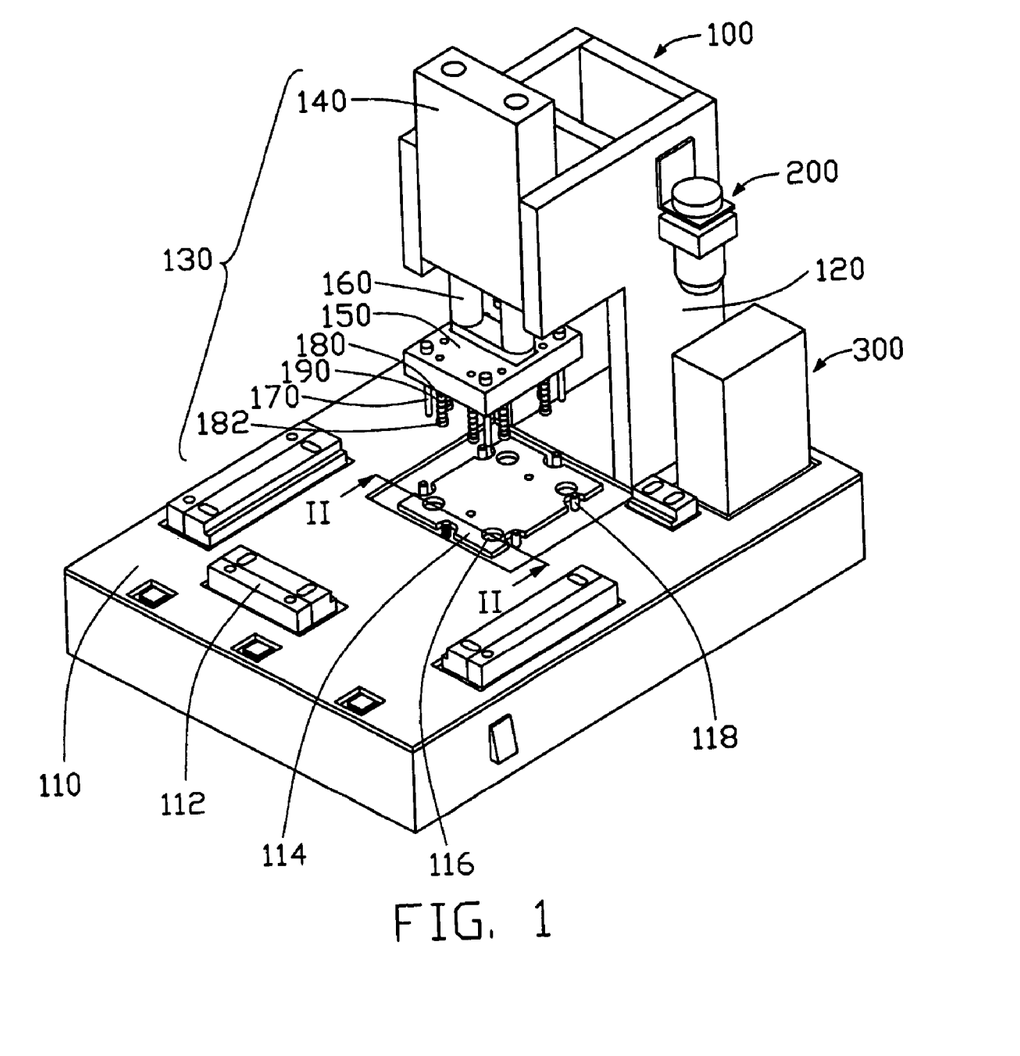
FIG. 1 is an isometric view of a stamping machine in accordance with the preferred embodiment of the present invention.
Figure 2:
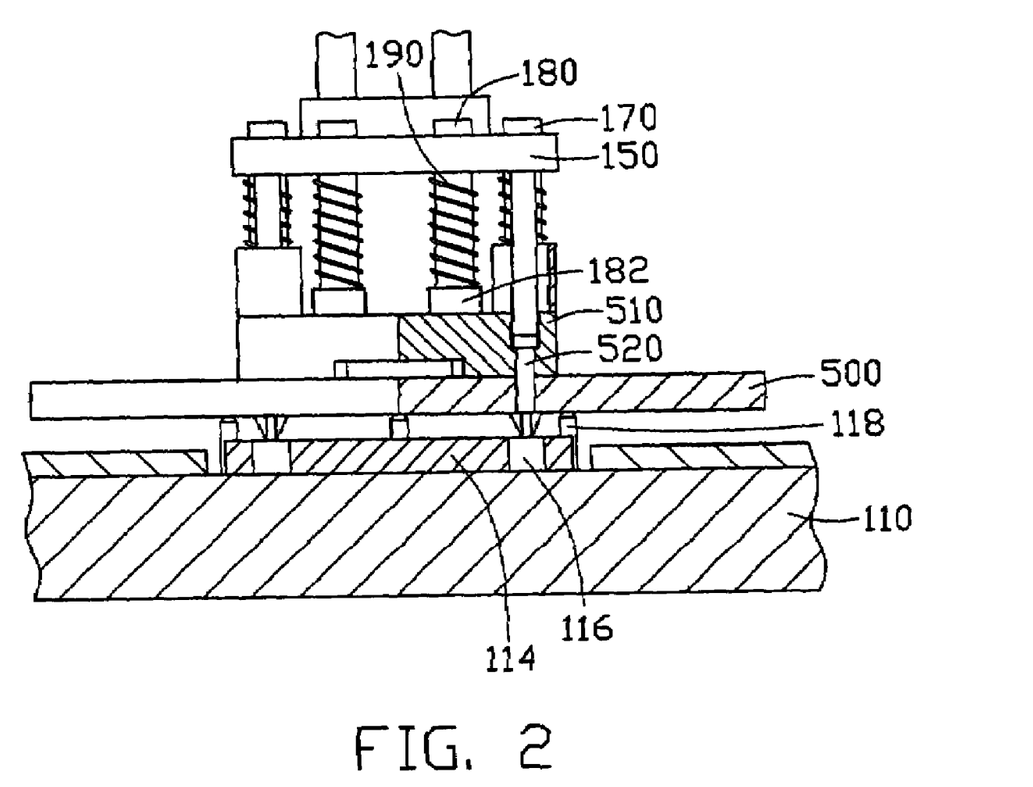
FIG. 2 is a schematic, partial cross sectional view corresponding to line II—II of FIG. 1.

Referring to FIGS. 1 and 2, a stamping machine in accordance with the preferred embodiment of the present invention is for mounting a retention frame 510 of a heat sink (not shown) to a motherboard 500. The stamping machine comprises a machine body 100, an adjusting device 200, and a control unit 300.

The machine body 100 is made from metal or a metallic alloy such as aluminum alloy, for providing rigidity. The machine body 100 comprises a support plane 110 and a stamping arm 120. A plurality of adjustable positioning blocks 112 is provided on the support plane 110, for positioning of the motherboard 500 on the support plane 110. A stamping assembly 130 positioned at a forepart of the stamping arm 120 comprises a cylinder 140, a stamping block 150, and a base portion 114. The stamping block 150 is connected to bottom ends of a pair of pistons 160 of the cylinder 140. The base portion 114 is received in a recess of the support plane 110, directly beneath the stamping block 150.

Four stamping posts 170 extend downwardly from four corners of the stamping block 150 respectively. A pair of retractable pressing pins 180 depends from the stamping block 150 adjacent to each stamping post 170. A coil spring 190 is disposed around each pressing pin 180. An enlarged pressing end 182 is provided at a bottom end of each pressing pin 180, to retain the spring 190 around the pressing pin 180. The pressing pins 180 can move up through the stamping block 150 in operation.

The base portion 114 defines four cutouts 116 corresponding to the stamping posts 170. A plurality of rigid support posts 118 extends upwardly from the support plane 110 in the recess. The support posts 118 are arranged in regular formation around the base portion 114, and are for supporting the motherboard 500 and preventing it from being bent or damaged during operation.

In operation, the motherboard 500 is placed on the support plane 110, and the positioning blocks 112 are adjusted to fittingly position the motherboard 500. The retention frame 510 is placed on the motherboard 500. The retention frame 510 defines four through holes (not labeled) in four corners thereof, in alignment with four through apertures (not labeled) of the motherboard 500 and the stamping posts 170 of the stamping block 150, respectively. Four rivets 520 each have a frustum-shaped bottom end. A slot is defined in the bottom end of each rivet 520 to provide it with resilient deformability. When the stamping block 150 is driven downwardly, the pressing pins 180 resiliently press against rims of the retention frame 510, so that the retention frame 510 is tightly retained on the motherboard 500. The rivets 520 are pre-positioned in the through holes of the retention frame 510. The stamping posts 170 force the rivets 520 successively through the through holes of the retention frame 510 and the through apertures of the motherboard 500, such that the bottom ends of the rivets 520 are engaged with an underside of the motherboard 500. In this position, the bottom ends of the rivets 520 are located in the cutouts 116 of the base portion 114. The retention frame 510 is thus mounted on the motherboard 500.

Figure 3:
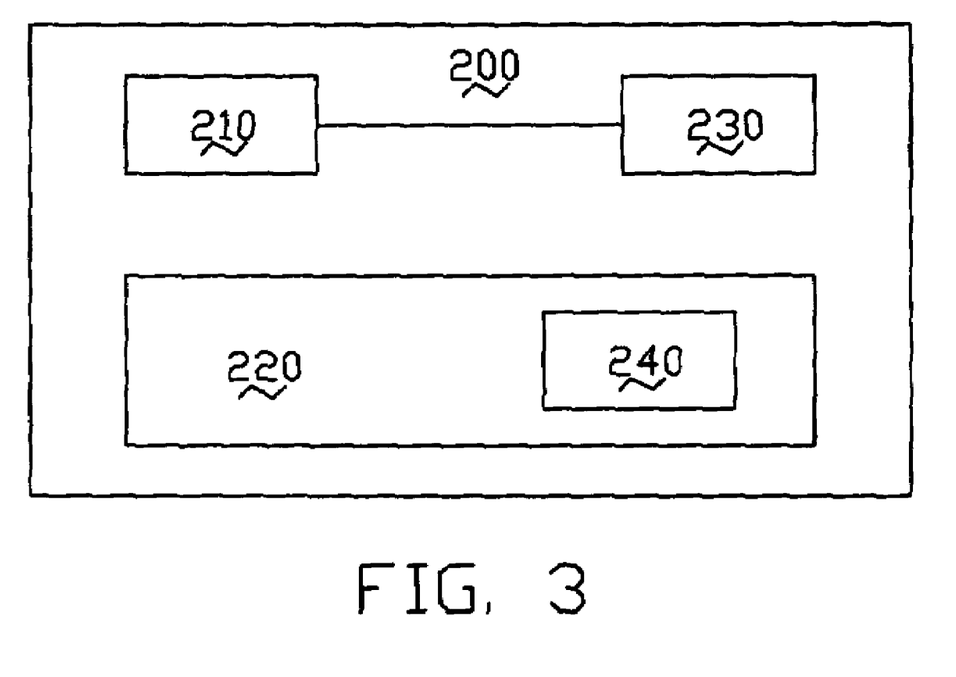
FIG. 3 is a block diagram of components of an adjusting device of the stamping machine of FIG. 1.

Referring also to FIG. 3, the adjusting device 200 is provided between the cylinder 140 and compressed air equipment such as an air pump (not shown). The adjusting device 200 is connected to an air inlet and an air outlet via two pipes (not shown) of the air pump. The adjusting device 200 comprises an adjusting unit 210 and a throttle unit 220. Input air pressure can be adjusted according to a status shown by an air pressure indicator 230. A throttle 240 is provided in the throttle unit 220 to control the rate of pulsing of input air pressure, so that the rate of stamping of the stamping block 150 can be suitably controlled.

Figure 4:
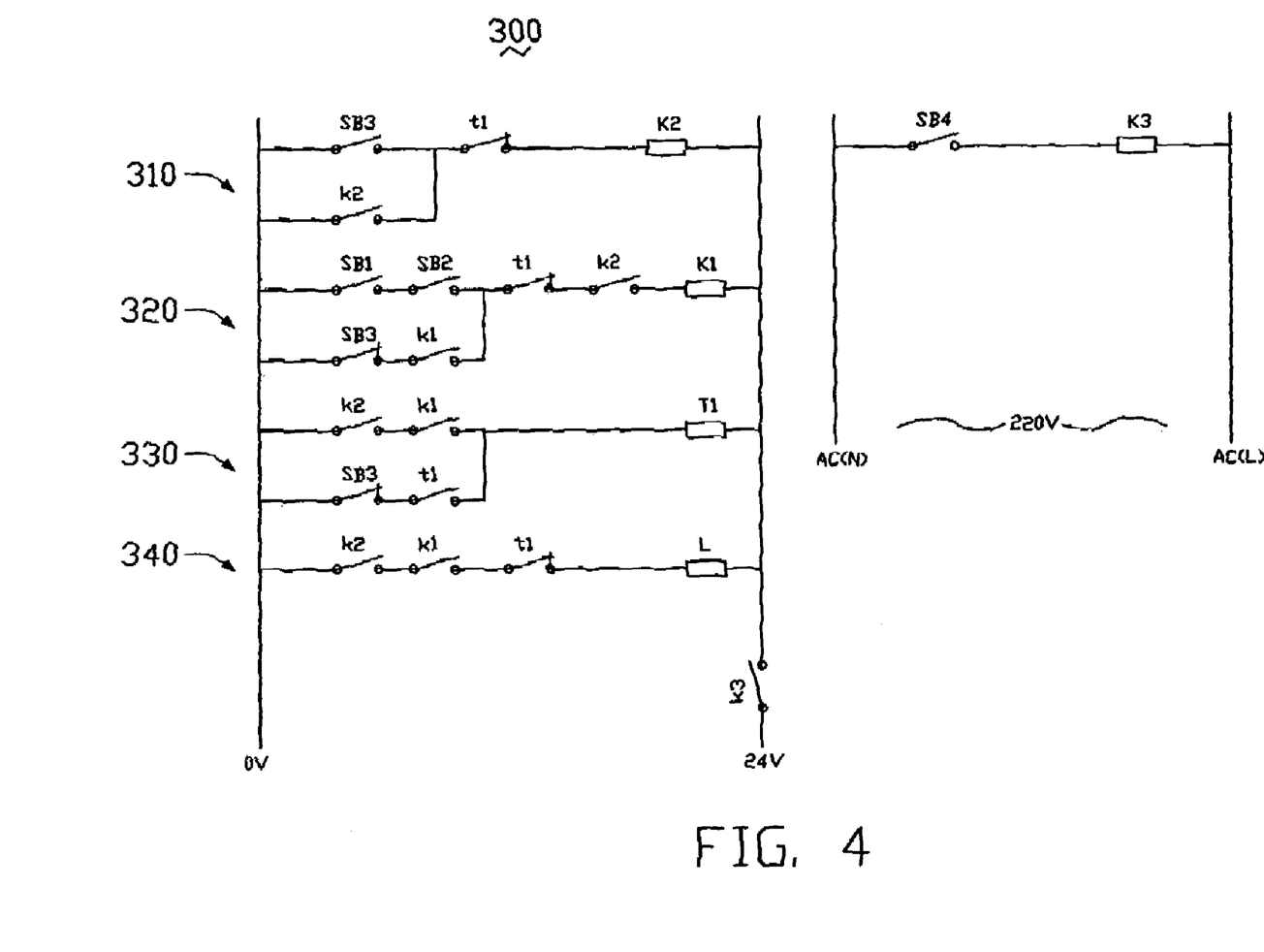
FIG. 4 is a schematic diagram of a program logic control circuit of the stamping machine of FIG. 1.

Referring also to FIG. 4, the control unit 300 comprises an Alternating Current (AC) loop and a Direct Current (DC) loop system (not labeled). The AC loop uses 220VAC and the DC loop system uses 24VDC. The DC loop system comprises four loops: the first loop 310, the second loop 320, the third loop 330, and the fourth loop 340. These loops comprise relays K1, K2, K3, touch switches SB1, SB2, SB3, a power supply switch SB4, an overtime relay T1, an electromagnetic valve L, and switches k1, k2, k3 and t1. Touch switches SB1, SB2 are buttons for controlling the circuit, touch switch SB3 is a button for protecting the circuit, the electromagnetic valve L is for controlling the cylinder 140, the switches k1, k2, k3 are common switches controlled by the relays K1, K2, K3 respectively, and the switch t1 is a common switch controlled by the overtime relay T1.

Operation of the control unit 300 is as follows. Firstly, the power supply switch SB4 is pressed to power on the AC loop, and the switch k3 is closed under control of the relay K3 to power on the DC loop. Secondly, the touch switch SB3 is pressed to power on the first loop 310, and the switch k2 is closed under control of the relay K2. Thirdly, the touch switches SB1 and SB2 are pressed at the same time to power on the second loop 320. The switch k1 is closed under control of the relay K1 to power on the third loop 330 and the fourth loop 340. Then the electromagnetic valve L controls the cylinder 140 to charge with air, so that the pistons 160 drive the stamping block 150 downwardly. The overtime relay T1 begins to time the cylinder 140. (At this time, if an unexpected contingency arises, the operator can press the touch switch SB3 to power off the second loop 320.) Accordingly, the switch k1 is opened under control of the relay K1 to power off the fourth loop 340, so that the electromagnetic valve L is powered off. This results in the cylinder 140 discharging the air, and the stamping block 150 being pulled upwardly by the pistons 160. The fourth step is automatic. The switch t1 operates when a first predetermined period of time has elapsed, so that the first loop 310, the second loop 320 and the fourth loop 340 are all powered off. The switches k1 and k2 are opened under control of the relays K1 and K2 respectively. At the same time, the cylinder 140 discharges the air under control of the electromagnetic valve L, and the stamping block 150 is retracted to its original position. The third loop 330 is still powered on because of the switch t1 being closed, but the overtime relay T1 begins to retime the operation of the cylinder 140. The fifth step is also automatic. The switch t1 operates when a second predetermined period of time has elapsed, so that all the loops revert to their original states and are ready for the next operation. Pressing the power supply switch SB4 can power off the whole control unit 300.

Figure 5:
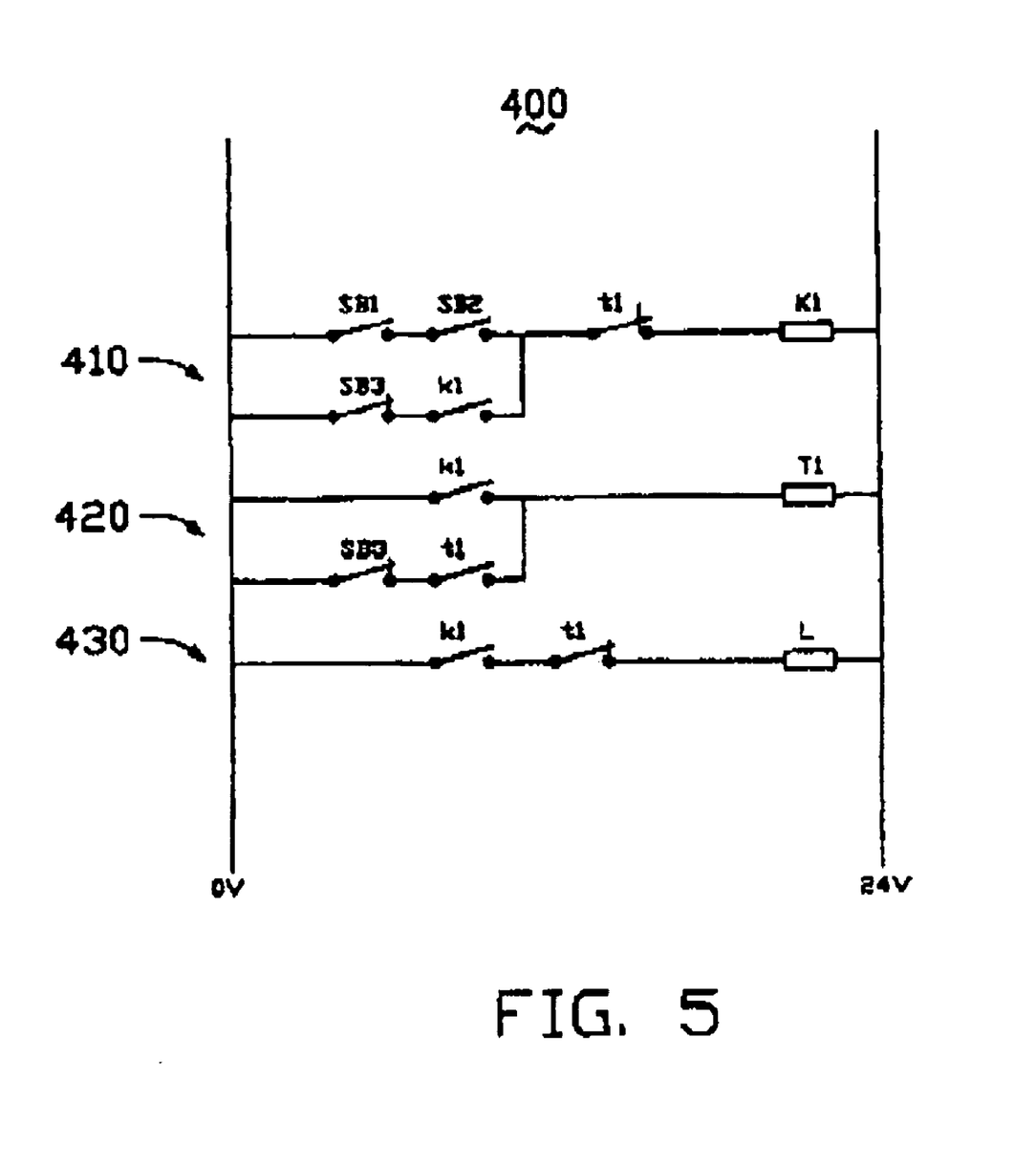
FIG. 5 is a schematic diagram of an alternative program logic control circuit of the stamping machine of FIG. 1.

Referring to FIG. 5, a control unit 400 in accordance with an alternative embodiment of the present invention only comprises a DC loop system. The DC loop system uses 24VDC, and employs the components as described above in relation to the control unit 300. The DC loop system comprises a first loop 410, a second loop 420, and a third loop 430.

Operation of the control unit 400 is as follows. Firstly, the touch switches SB1 and SB2 are pressed at the same time to power on the first loop 410. The switch k1 is closed under control of the relay K1 to power on the second loop 420, and the overtime relay T1 begins to time the cylinder 140. At the same time, the third loop 430 is also powered on, and the electromagnetic valve L controls the cylinder 140 to charge with air. (At this time, if an unexpected contingency arises, the operator can press the touch switch SB3 to power off the first loop 410.) Accordingly, the switch k1 is opened under control of the relay K1 to power off the third loop 430. The cylinder 140 discharges air under control of the electromagnetic valve L, and the stamping block 150 is retracted to its original position. The second step is automatic. The switch t1 operates when a first predetermined period of time has elapsed, so that the first loop 410 and the third loop 430 are both powered off. The switch k1 opens under control of the relay K1. At the same time, the cylinder 140 discharges air under control of the electromagnetic valve L, and the stamping block 150 is retracted to its original position. The second loop 420 is still powered on because of the switch t1 being closed, but the overtime relay T1 begins to retime the operation of the cylinder 140. The third step is also automatic. The switch t1 operates when a second predetermined period of time has elapsed, so that all the loops revert to their original states and are ready for the next operation.

The control unit 400 is more simple in configuration than the control unit 300 of the preferred embodiment of the present invention. On the other hand, the control unit 300 comprises an AC current loop that supplies power. If an unexpected contingency arises and the power supply switch SB4 of the control unit 300 is pressed to power off the AC loop, this instantaneously powers off both the AC loop and the DC loop system. There is no delay in powering off.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A stamping machine adapted for mounting a retention frame of a heat sink to a motherboard, the stamping machine comprising:
   a machine body comprising:
      a support plane, a plurality of adjustable positioning blocks provided on the support plane adapted to fittingly position the motherboard;
      a stamping arm extending upwardly from the support plane, a stamping assembly positioned at a forepart of the stamping arm comprising a cylinder, a stamping block moveably connected to the cylinder, and a base portion attached on the support plane corresponding to the stamping block, a plurality of stamping posts extending from the stamping block, a plurality of retractable pressing pins depending from the stamping block, a resilient member disposed around each of the pressing pins; and
   a control unit controlling stamping of the stamping block, wherein the control unit comprises an Alternating Current (AC) loop and a Direct Current (DC) loop system, the AC loop comprises a power supply switch and a first relay connected in series to an AC power source, the DC loop system comprises a protecting loop, a start-up loop having two touch switches connected in series to be simultaneously pressed to start up the cylinder, an overtime loop having an overtime relay, and a control loop comprising an overtime relay switch controlled by the overtime relay, and an electromagnetic valve connected in series to the overtime relay switch to control the cylinder, and wherein the four loops of the DC loop system are connected in parallel to a DC power source via a relay switch which is controlled by the first relay of the AC loop.

2. The stamping machine as claimed in claim 1, wherein the machine body is made from metal or a metal allay.

3. The stamping machine as claimed in claim 2, further comprising adjusting device, wherein the adjusting device comprises an adjusting unit and a throttle unit, the adjusting unit adjusts input air pressure via an indicator, and a throttle is provided in the throttle unit to control the rate of the input air pressure for controlling a rate of stamping of the stamping block.

4. The stamping machine as claimed in claim 1, wherein the stamping block is connected to the cylinder via a pair of pistons.

5. The stamping machine as claimed in claim 1, wherein the base portion is received in the support plane, the base portion defines a plurality of cutouts respectively in alignment with the stamping posts, and a plurality of support posts extends upwardly from the support plane and is arranged in regular formation around the base portion for supporting the motherboard and preventing the motherboard from being bent or damaged during operation.

6. The stamping machine as claimed in claim 1, wherein the AC loop uses 220 V AC and the DC loop system uses 24 V DC.

7. The stamping machine as claimed in claim 1, wherein the protecting loop comprises a touch-to-close switch and a relay switch controlled by a second relay connected in parallel and then connected with a common-closed overtime relay switch controlled by the overtime relay, and the second relay in series; the start-up loop comprises a touch-to-open switch and a relay switch controlled by a third relay in series, then connected in parallel to the two touch switches in series, and then connected to a common-closed overtime relay switch, a relay switch controlled by the second relay, and the third relay in series; the overtime loop comprises two series-connected relay switches respectively controlled by the second and third relays, then connected in parallel to a touch-to-open switch and a common-open overtime relay switch controlled by the overtime relay in series, and then connected to the overtime relay in series; the control loop comprises two relay switches respectively controlled by the second and third relays, a common-closed overtime relay switch controlled by the overtime relay, and the electromagnetic valve connected in series.

8. A stamping machine adapted the mounting a retention frame of a heat sink to a motherboard, the stamping machine comprising:
   a machine body comprising:
      a support plane, a plurality of adjustable positioning blocks provided on the support plane for fittingly positioning the motherboard;
      a stamping arm extending upwardly from the support plane;
      a stamping assembly positioned at a forepart of the stamping arm comprising a cylinder, a stamping block moveably connected to the cylinder, and a base portion attached on the support plane corresponding to the stamping block, a plurality of stamping posts extending from the stamping block, a plurality of retractable pressing pins depending from the stamping block, a resilient member disposed around each of the pressing pins;
   an adjusting device provided between the cylinder and compressed air equipment for adjusting input air pressure; and
   a control unit controlling stamping of the stamping block, the control unit comprising a start-up loop including two touch switches connected in series to be simultaneously pressed to start up the cylinder, under an overtime loop including an overtime relay, and a control loop including a common-closed overtime relay switch controlled by the overtime relay, and an electromagnetic valve connected in series to the overtime relay switch to control the cylinder; the three loops connected in parallel to a DC power source.

9. The stamping machine as claimed in claim 8, wherein the stamping block is connected to the cylinder via a pair of pistons.

10. The stamping machine as claimed in claim 8, wherein the base portion is received in the support plane, the base portion defines a plurality of cutouts respectively in alignment with the stamping posts, and a plurality of support posts extends upwardly from the support plane and is arranged in regular formation around the base portion for supporting the motherboard and preventing the motherboard from being bent or damaged during operation.

11. The stamping machine as claimed in claim 8, wherein the adjusting device comprises an adjusting unit and a throttle unit.

12. The stamping machine as claimed in claim 11, wherein the adjusting unit adjusts the input air pressure according to a status shown by an air pressure indicator, a throttle is provided in the throttle unit for controlling pulsing of the input air pressure so that a rate of stamping of the stamping block can be suitably controlled.

13. The stamping machine as claimed in claim 8, wherein the control unit comprises an Alternating Current (AC) loop and a Direct Current (DC) loop system, the AC loop comprises a power supply switch and a relay connected in series between an AC power source, the start-up loop, the overtime loop, and the control loop are connected in parallel to the DC power source via a relay switch which is controlled by the relay of the AC loop.

14. The stamping machine as claimed in claim 13, wherein the AC loop uses 220 V AC and the DC loop system uses 24 V DC.

15. The stamping machine as claimed in claim 8, wherein the start-up loop comprises a touch-to-open switch and a relay switch controlled by a relay in series, then connected in parallel to the two touch switches, and then connected to a common-closed overtime relay switch controlled by the overtime relay, and the relay in series; the overtime loop comprises a relay switch controlled by the relay, connected in parallel to the touch-to-open switch and a common-open overtime relay switch controlled by the overtime relay in series, and then connected to the overtime relay in series; the control loop comprises a relay switch controlled by the relay, the overtime relay switch, and the electromagnetic valve in series.

* * * * *